United States Patent
Parashari et al.

(10) Patent No.: US 11,921,581 B1
(45) Date of Patent: Mar. 5, 2024

(54) READ RECOVERY INCLUDING LOW-DENSITY PARITY-CHECK DECODING

(71) Applicant: Micron Technology, Inc., Boise, ID (US)

(72) Inventors: Prashant Parashari, Hyderabad (IN); Gaurav Singh, Hyderabad (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/887,813

(22) Filed: Aug. 15, 2022

(51) Int. Cl.
*G06F 11/10* (2006.01)
*G06F 11/00* (2006.01)
*H03M 13/00* (2006.01)
*H03M 13/11* (2006.01)

(52) U.S. Cl.
CPC ..... *G06F 11/1076* (2013.01); *H03M 13/1111* (2013.01); *H03M 13/611* (2013.01)

(58) Field of Classification Search
CPC .............. G06F 11/1076; G06F 11/108; H03M 13/1111; H03M 13/611
See application file for complete search history.

(56) References Cited

U.S. PATENT DOCUMENTS

| | | | |
|---|---|---|---|
| 7,263,651 B2 | 8/2007 | Xia et al. | |
| 7,917,829 B2 | 3/2011 | Livshitz | |
| 9,659,637 B2 * | 5/2017 | Song | G11C 11/5642 |
| 9,940,194 B2 * | 4/2018 | Achtenberg | G06F 11/1012 |
| 10,230,406 B2 * | 3/2019 | Zhong | G11C 16/26 |
| 10,340,951 B2 | 7/2019 | Symons et al. | |
| 10,636,504 B2 * | 4/2020 | Reusswig | G11C 29/52 |
| 11,461,020 B2 * | 10/2022 | Amato | G06F 3/0622 |
| 11,663,079 B2 * | 5/2023 | Nguyen | G06F 11/1012 |
| | | | 714/6.22 |

* cited by examiner

*Primary Examiner* — Justin R Knapp
(74) *Attorney, Agent, or Firm* — Brooks, Cameron & Huebsch, PLLC

(57) ABSTRACT

A sign bit of a low-density parity-check (LDPC) codeword associated with a translation unit (TU) can be generated by performing an XOR operation on a RAIN drop corresponding to the TU and a raw read of the TU. The LDPC codeword can include a hard bit and three soft bits that include the sign bit. The LDPC codeword can be decoded using the hard bit and the three soft bits. A read recovery operation can be performed on the TU using the decoded LDPC codeword.

20 Claims, 4 Drawing Sheets

US 11,921,581 B1

READ RECOVERY INCLUDING LOW-DENSITY PARITY-CHECK DECODING

TECHNICAL FIELD

Embodiments of the disclosure relate generally to integrated circuits, and more specifically, relate to read recovery including low-density parity-check (LDPC) decoding.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
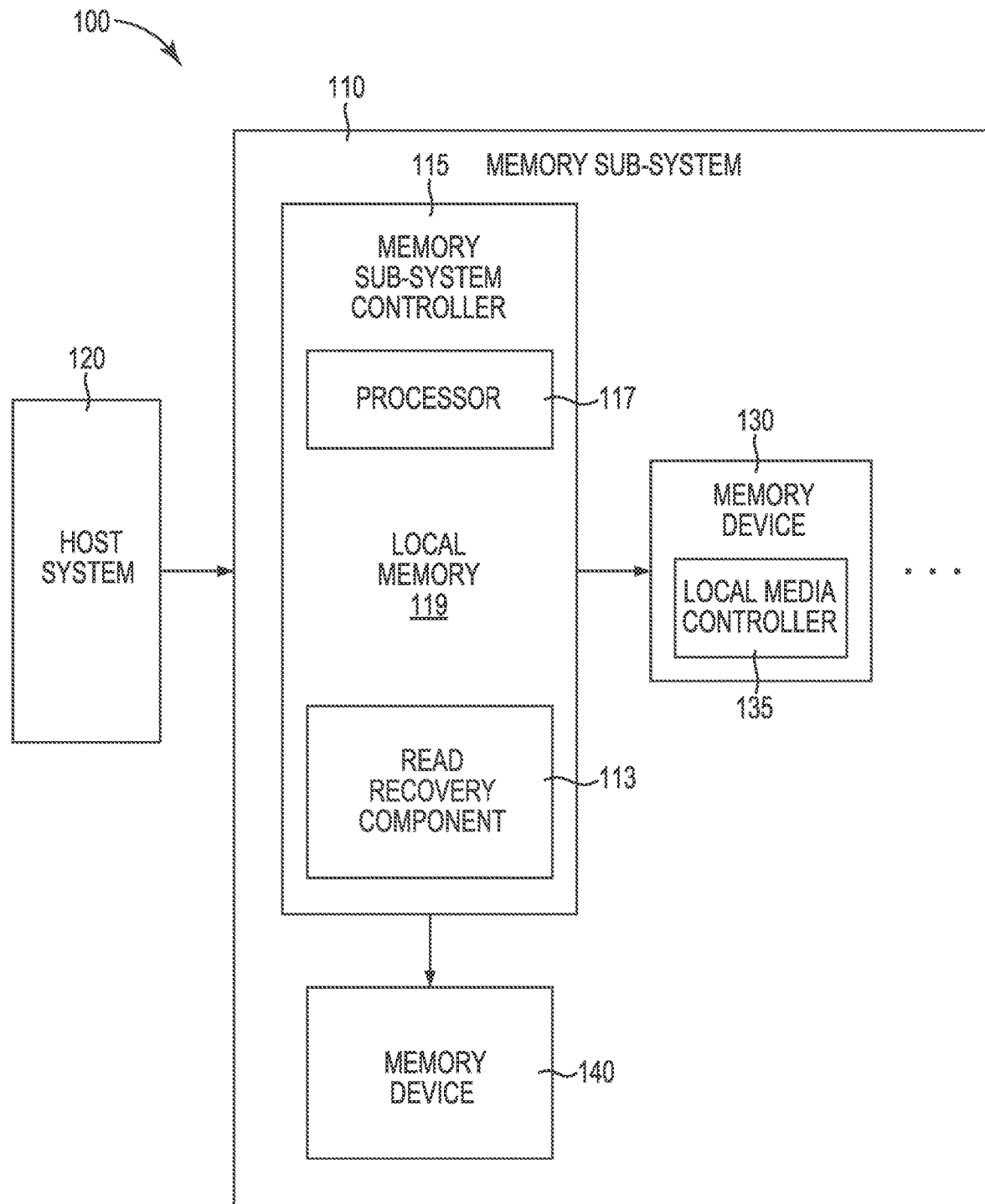
FIG. 1 is a block diagram of an example computing system that includes a memory sub-system in accordance with some embodiments of the present disclosure.

Aspects of the present disclosure are directed to read recovery in a memory sub-system in which a subset of operations of an error handling flow are performed. As used herein, the term "error handling flow" generally refers to a series of operations to recover data that includes one or more errors. Generally, each operation of an error handling flow employs increasingly complex techniques to attempt to recover the data. As the complexity of the operations increases, so do the latency and/or the resources to complete the operations. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1," or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates.

The pages of memory cells of, for example, a NAND memory device can be arranged in a row and have a bit line structure that connects into a memory "address" called a word line. The address provides a means of identifying a location for data storage, and the word line forms an electrical path allowing all the memory cells on that row to be activated at the same time for storage ("write") or retrieval ("read"). A set of memory cells (e.g., a page of memory cells or multiple pages of memory cells) that are coupled to a particular word line or to a set of particular word lines can be referred to herein as a "word line group" or a "page of memory cells of a word line group." In the alternative, a word line group can be described as comprising or including one or more pages or sets of memory cells.

Due to the characteristics of memory cells, and, more specifically, the inherent characteristics of non-volatile memory cells (e.g., NAND memory cells), a quality of such memory cells generally degrade over time. This degradation in quality can be based on a quantity of program-erase cycles (PECs) experienced by the memory cells, a frequency that data is written to or read from the memory cells, an amount of time that data written to the memory cells is stored by the memory cells, workloads experienced by the memory cells, operational temperatures of the memory cells, and/or process variations within the memory cells (or sets of the memory cells), among other factors that can contribute to degradation of such memory cells. This degradation of quality of the memory cells can give rise to errors involving data written to the memory cells, which can be costly to correct in terms of time, power consumption, cross-temperature behavior, and/or quality of service (QoS).

Some previous approaches attempt to mitigate the adverse effects of such degradation may include executing error handling flows. Execution of error handling flows include performance of operations directed to mitigate effects of errors. Each stage or step of an error handling flow operation employs increasingly complex techniques to attempt to resolve one or more errors. An error handling flow may be referred to herein in the alternative as a "error recovery flow." Performance of a read operation may return bits from memory cells (e.g., NAND memory cells) that are different from bits written to the memory cells. For instance, a logical "0" written to a memory cell may be read as a logical "1," or vice versa. Error handling flows can include hardware-based and/or firmware-based features to handle (mitigate effects of) such errors to improve reliability of a memory device while reducing or minimizing impact on host latency and/or performance. For example, a memory device can proactively mitigate effects of read errors by reading data that a host otherwise would not read to improve reliability of the memory device.

As described herein, an error handling flow can include one or more read recovery steps. The error handling flow can include performing steps that are simple and consume less resources (e.g., time, power) before performing steps that are increasingly complex and consume more resources. Steps of an error handling flow, and execution thereof, can be managed by control circuitry (e.g., backend processors) of a memory device. Read recovery steps of an error handling flow can include LDPC error correction code (ECC) decoding (referred to herein as LPDC decoding) in a hard mode and/or soft mode. If all other read recovery steps of an error handling flow fail, then the error handling flow can include performing a redundant array of independent NAND (RAIN) recovery operation.

As used herein, a RAIN recovery operation refers to a read recovery operation utilizing RAIN parity protection. RAIN parity protection for a memory sub-system (in an SSD, for example) can require a significant portion of an end-user capacity of the SSD. In other words, the amount of NAND available to the user can be reduced by employing RAIN parity protection. The term "RAIN," as used herein, is an umbrella term for computer information (e.g., data) storage schemes that divide and/or replicate (e.g., mirror) information among multiple pages of a memory sub-system, for instance, in order to help protect data stored in the memory sub-system. A RAIN array may appear to a user and the operating system of a computing device as a single memory device (e.g., disk). RAIN can include striping (e.g., splitting) information so that different portions of the information are stored on different pages of the memory sub-system. The portions of the memory sub-system that store the split data can be collectively referred to as a RAIN stripe. As used herein, RAIN can also include mirroring, which can include storing duplicate copies of data on more than one page of more than one memory sub-system.

A RAIN stripe can include (e.g., be a combination of) user data and parity data. The parity data of a RAIN stripe can include error protection data that can be used to protect user data stored in the memory sub-system against defects and/or errors that may occur during operation of the memory sub-system and, therefore, can provide protection against a failure of the memory sub-system. RAIN parity protection generally utilizes storage in cache memory of a controller of a memory sub-system. A RAIN recovery operation can consume a lot of resources, such as machine cycles and dynamic memory allocations. A RAIN recovery operation can include communication between multiple cores (depending upon on a firmware architecture) to be successful. Thus, it is beneficial to recover data from a read error without performing a RAIN recovery operation.

Aspects of the present disclosure address the above and other deficiencies inherent in previous approaches by increasing a capability of conventional read retry algorithms by providing improved decoder capability to recover a failed translation unit (TU) to reduce the need to perform a RAIN recovery operation. Logical block addressing is a scheme that can be used by a host for identifying a logical region of data. A logical address from the host is translated into a TU, which is the smallest unit of non-volatile memory managed by a logical-to-physical mapping table. Although the present disclosure describes examples and embodiments with reference to TUs, examples and embodiments of the present disclosure are not so limited. Embodiments of the present disclosure can be implement and/or employed on any data and subset thereof (e.g., page, block, etc. of a memory device).

Embodiments of the present disclosure utilize a RAIN drop associated with a failed TU. As used herein, a "failed TU" refers to a TU that includes an error (e.g., corrupted data). A RAIN drop is calculated and written when a RAIN stripe is written. As used herein, a "RAIN drop" refers to a parity bit of a RAIN stripe, which can be calculated by performing a XOR operation using data that is written when the RAIN stripe is written. An exclusive OR (XOR) operation can be performed on a RAIN drop associated with a failed TU and a raw read of the failed TU. As used herein, a "raw read" refers to a read operation performed without any error correction. The result of the XOR operation can serve as a third soft bit (e.g., a sign bit) in a decoding algorithm that utilizes a hard bit and three soft bits (1H3S decoding algorithm). Some embodiments of the present disclosure include an 1H3S decoding algorithm that can increase a likelihood of recovery of a failed TU. Utilizing an 1H3S decoding algorithm can increase a capability of back-end circuitry to recover the failed TU so that a RAIN recovery operation can be avoided. A RAIN recovery operation may require multiple machine cycles of a state machine allocation of a significant amount of memory space, and/or a significant of amount of bandwidth, thereby causing a negative impact on performance of a memory sub-system, and a system including the memory sub-system. In contrast, embodiments of the present disclosure reduce, or even eliminate, initiating a RAIN recovery operation such that a failed TU can be recovered without incurring the machine cycles and memory space requirements of a RAIN recovery operation.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a read recovery component 113. Although not shown in FIG. 1 so as to not obfuscate the drawings, the error read recovery component 113 can include various circuitry to facilitate recovery of a page or TU subsequent to a failed read of the page or TU. In some embodiments, the read recovery component 113 can generate a soft bit, for an 1H3S decoding algorithm based on a raw read of a page or TU and a RAIN stripe associated with the page or TU. An XOR operation can be performed on the raw read and a RAIN drop to generate the soft bit. The soft bit can be in addition to soft bits from the raw read of the page or TU.

In some embodiments, the read recovery component 113 can direct performance of a raw read of a TU. The read recovery component 113 can direct performance of an XOR operation on the RAIN drop and the raw read of the TU to generate a third soft bit. The read recovery component 113 can direct execution of an error handling flow in response to a read error of the TU. The read recovery component 113 can direct communication of the recovered TU to a component that issued a read request for the TU.

Execution of the error handling flow can include performance of a number of read retries on the TU. In response to the number of read retries being unsuccessful, the XOR operation can be performed on the RAIN drop and the raw read of the TU to generate the third soft bit. Execution of the error handling flow can include decoding a LDPC codeword comprising the hard bit and the first, second, and third soft bits.

In some embodiments, the memory sub-system controller 115 includes at least a portion of the read recovery component 113. For example, the memory sub-system controller 115 can include a processor 117 (processing device) configured to execute instructions stored in local memory 119 for performing the operations described herein. In some embodiments, the read recovery component 113 is part of the host system 120, an application, or an operating system.

In some embodiments, the memory sub-system 110, and hence the read recovery component 113, the processor 117, and the memory devices 130/140, can be resident on a mobile computing device such as a smartphone, laptop, or phablet among other similar computing devices. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device or any other type of edge computing device(s).

Further, the read recovery component 113 can be resident on the memory sub-system 110. As used herein, the term "resident on" refers to something that is physically located on a particular component. For example, the read recovery component 113 being "resident on" the memory sub-system 110 refers to a condition in which the hardware circuitry that comprises the read recovery component 113 is physically located on the memory sub-system 110. The term "resident on" can be used interchangeably with other terms such as "deployed on" or "located on," herein.

Figure 2:
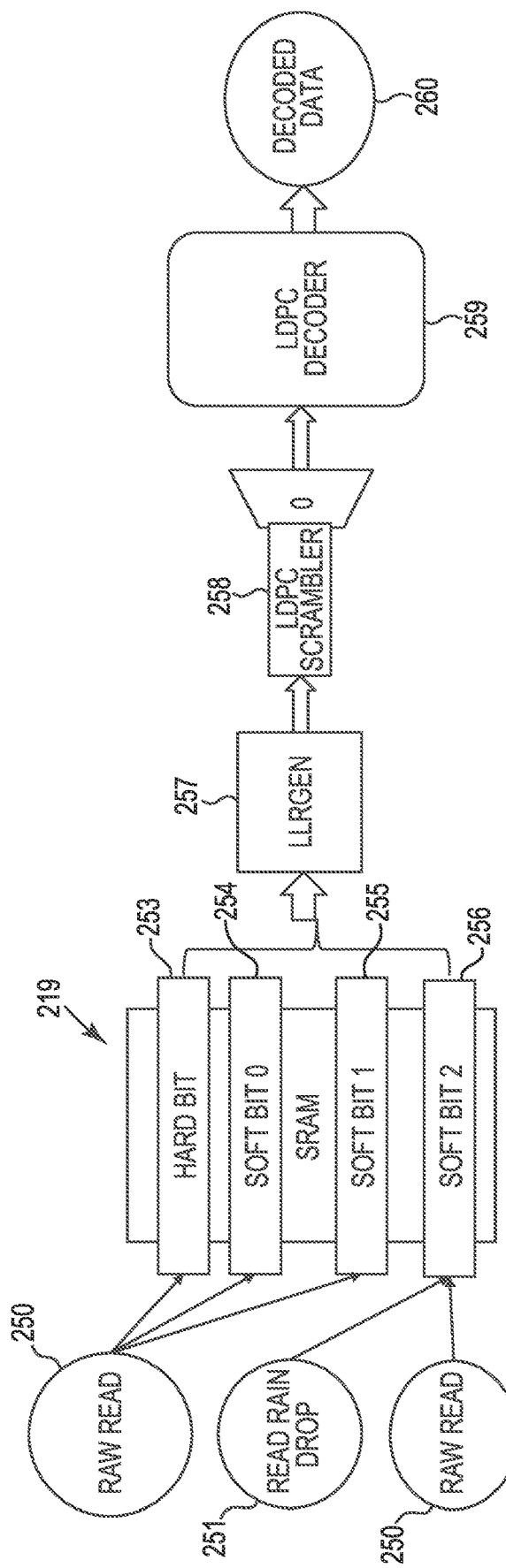
FIG. 2 is a block diagram representative of LPDC decoding in accordance with some embodiments of the present disclosure.

FIG. 2 is a block diagram representative of LPDC decoding in accordance with some embodiments of the present disclosure. The static random access memory (SRAM) 219 can be analogous to the local memory 119 described in association with FIG. 1. FIG. 2 illustrates both steps of LPDC decoding and components of control circuitry (e.g., the memory sub-system controller 115) that can be utilized to perform 1H3S LDPC decoding. The SRAM 219, log likelihood ratio (LLR) generator 257, LDPC scrambler 258, and/or LDPC decoder 259 can be components of the read recovery component 113.

At 250, shown twice for clarity, a raw read can be performed on a TU (e.g., a failed TU) including an error. Some embodiments of the present disclosure can include determining that the TU has an error. For instance, determining that the TU as written does not match the TU as read. The raw read at 250 can yield and/or include reading parity data associated with the TU. The parity data can include a hard bit 253, soft bit 0 254, and soft bit 1 255. The parity data can be stored in the SRAM 219. Although shown in FIG. 2 as an SRAM, embodiments are not so limited, and other types of memory resources (persistent or non-persistent) and/or caches can be substituted for the SRAM 219 in accordance with the present disclosure.

At 251, a RAIN drop associated with the TU can be read. Although not specifically illustrated, the RAIN drop can be stored in the SRAM 219. The RAIN drop can be associated with a block stripe or a RAIN stripe to which the TU corresponds. The RAIN drop can be generated as part of writing a block stripe or a RAIN stripe such that, for the purposes of the present disclosure, the RAIN drop can be considered as pre-existing. Some embodiments include generating a third soft bit (soft bit 2 256) in addition to the soft bit 0 254 and the soft bit 1 255. In some embodiments, the soft bit 0 254 and the soft bit 1 255 can be generated as part of writing the TU such that, for the purposes of the present disclosure, the soft bit 0 254 and the soft bit 1 255 can be considered as pre-existing. In contrast, as described herein, the soft bit 2 256 can generated for 1H3S decoding such that the soft bit 2 256 can be considered as not pre-existing. Generating the soft bit 2 256 can include performing an XOR operation on the RAIN drop (read at 251) and the raw read of the TU (at 250). The result of the XOR operation can be indicative of confidence of being able to recover the TU via decoding a LDPC codeword including the hard bit 253, the soft bit 0 254, the soft bit 1 255, and the soft bit 2 256.

The LLR generator 257, which can include firmware and/or hardware, can be coupled to the SRAM 219. The hard bit 253, the soft bit 0 254, the soft bit 1 255, and the soft bit 2 256 can be input to the LLR generator 257 to generate one or more LLRs. A first LLR can be generated based on the soft bit 0 254 and the soft bit 1 255. The first LLR can be referred to as a channel LLR. A second LLR can be generated based on the soft bit 2 256. The second LLR can be referred to an extrinsic LLR. A LDPC scrambler 258 can be coupled to the LLR generator 257. The LDPC scrambler 258 can be deactivated in response to receiving LLRs. Some embodiments may not include a LDPC scrambler. The LDPC scrambler 258 can scramble incoming data to replace sequences of consecutive logical "1s" or logical "0s" to enable data to be effectively decoded. As illustrated by FIG. 2, in some embodiments, the LDPC scrambler 258 can include a demultiplexer to parse the data (e.g., scrambled bit string) for decoding.

The LPDC decoder 259 can be coupled to the LLR generator 257 and/or the LDPC scrambler 258. The LDPC decoder 259, which can include firmware and/or hardware, can be configured to decode a 1H3S LDPC codeword including the hard bit 253, the soft bit 0 254, the soft bit 1 255, and the soft bit 2 256. Decoding the 1H3S LDPC codeword can be part of a read recovery operation. Decoding the 1H3S LDPC codeword, and operations associated therewith (e.g., reading the RAIN drop at 251, generating the soft bit 2 256), can be a step of an error handling flow. Decoded data 260, yielded from decoding the 1H3S LDPC codeword, can be used to recover the TU. If recovery of the TU is unsuccessful, then a RAIN recovery operation can be performed. If recovery of the TU is successful, then a RAIN recovery operation is rendered unnecessary.

Figure 3:
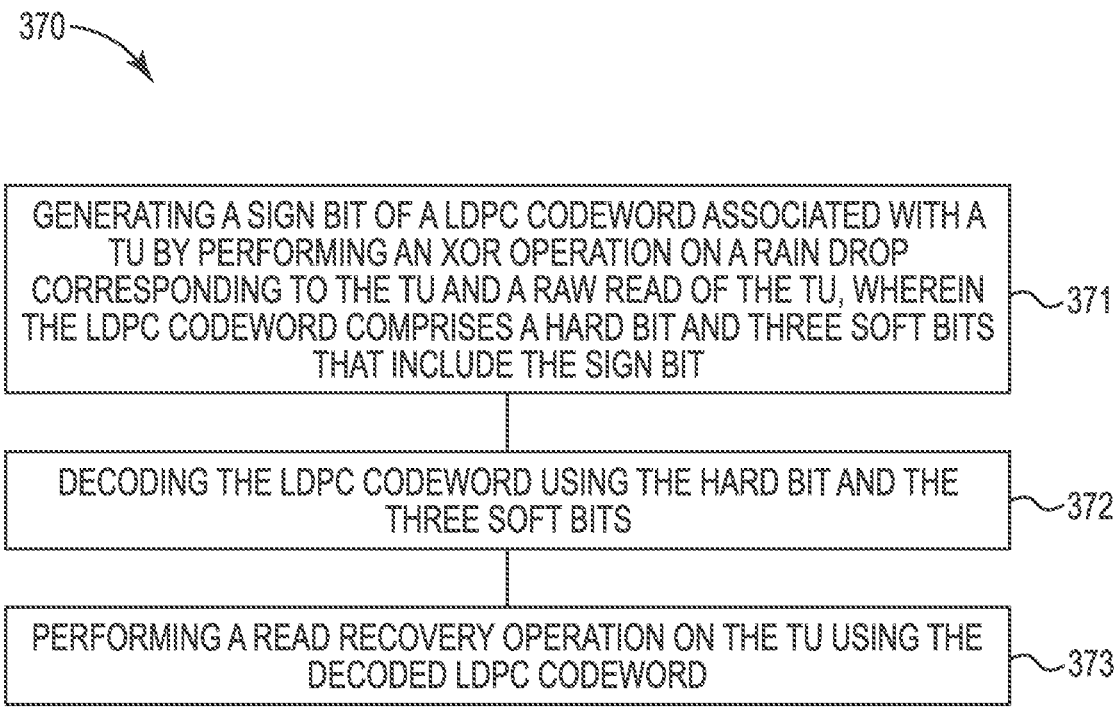
FIG. 3 is a flow diagram corresponding to a method for read recovery in accordance with some embodiments of the present disclosure.

FIG. 3 is a flow diagram corresponding to a method 370 for read recovery in accordance with some embodiments of the present disclosure. The method 370 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 370 is performed by one or more components of the memory sub-system 110 described in association with FIG. 1, such as the read recovery component 113. Although shown in a particular sequence or order, unless otherwise specified, the order of the method 370 can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 371, the method 370 can include generating a sign bit of a LDPC codeword associated with a TU by performing an XOR operation on a RAIN drop corresponding to the TU and a raw read of the TU. The LDPC codeword can include a hard bit and three soft bits that include the sign bit. The sign bit can be generated in response to the TU including an error. The sign bit can be generated in response to an unsuccessful read retry operation of an error handling flow performed on the TU. Generating the sign bit can include performing a raw read of the TU. Performing the raw read of the TU can yield the hard bit and two of the three soft bits other than the sign bit.

At 372, the method 370 can include decoding the LDPC codeword using the hard bit and the three soft bits. Decoding the LDPC codeword comprises generating an LLR based on the three soft bits. A first LLR can be generated based on the two soft bits other than the sign bit. A second LLR can be generated based on the sign bit. At 373, the method 370 can include performing a read recovery operation on the TU using the decoded LDPC codeword.

Although not specifically illustrated, the method 370 can include performing a read operation on a page of a block stripe including the TU. The method 370 can include performing a RAIN recovery operation of the error handling flow in response to an unsuccessful recovery of the TU using the decoded LDPC codeword.

Figure 4:
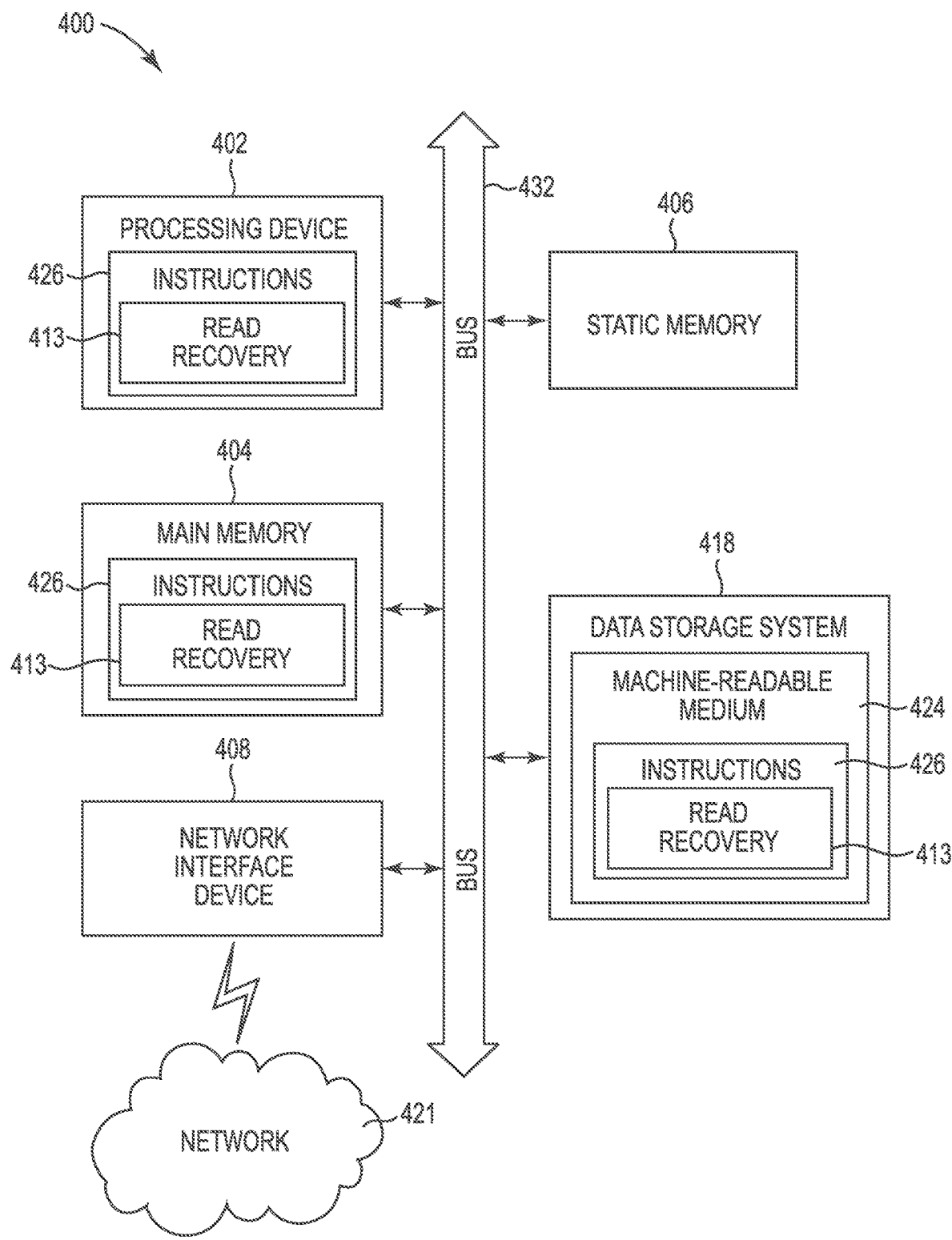
FIG. 4 is a block diagram of an example computer system in which embodiments of the present disclosure may operate.

FIG. 4 is a block diagram of an example computer system 400 in which embodiments of the present disclosure may operate. For instance, the computer system 400 within which a set of instructions, for causing the machine to perform any one or more of the methodologies discussed herein, can be executed. In some embodiments, the computer system 400 can correspond to a host system (e.g., the host system 120 described in association with FIG. 1) that includes, is coupled to, and/or utilizes a memory sub-system (e.g., the memory sub-system 110) or can be used to perform the operations of a controller (e.g., to execute an operating system to perform operations corresponding to the read recovery component 113). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 432.

The processing device 402 represents one or more general-purpose processing devices, such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 421.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110.

In some embodiments, the instructions 426 include instructions to implement functionality corresponding to a read recovery component (e.g., the read recovery component 113). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

In some embodiments, the instructions 426 can include instructions to execute an error handling flow in response to a TU including an error. The instructions to execute the error handling flow can include instructions executable to perform a number of read retry operations on the TU. The instructions to execute the error handling flow can include instructions executable to, responsive to the number of read retry operations being unsuccessful, perform an XOR operation on a RAIN drop corresponding to the TU and a raw read of the TU. A result of the XOR operation is a sign bit of a LDPC codeword associated with the TU. The instructions to execute the error handling flow can include instructions executable to decode the LDPC codeword using the sign bit and a hard bit and two soft bits based on the raw read of the TU and attempt to recover the TU using the decoded LDPC codeword. The instructions to execute the error handling flow can include instructions executable to, prior to performing the XOR operation, attempt to recover the TU using a different LDPC codeword comprising the hard bit and the two soft bits and determine whether the attempt to recover the TU using the different LDPC codeword is successful. The instructions to execute the error handling flow can include instructions executable to, responsive to determining that the attempt to recover the TU using the different LDPC codeword is unsuccessful, perform the XOR operation. The instructions to execute the error handling flow can include instructions executable to, responsive to determining that the attempt to recover the TU using the different LDPC codeword is successful, exiting the error handling flow.

The instructions 426 can include instructions executable to determine whether the attempt to recover the TU is successful. The instructions 426 can include instructions executable to, responsive to determining that the attempt to recover the TU is unsuccessful, perform a RAIN recovery operation. The instructions 426 can include instructions executable to, responsive to determining that the attempt to recover the TU is successful, exiting the error handling flow.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   generating a sign bit of a low-density parity-check (LDPC) codeword associated with a translation unit (TU) by performing an exclusive OR (XOR) operation on a redundant array of independent NAND (RAIN) drop corresponding to the TU and a raw read of the TU, wherein the LDPC codeword comprises a hard bit and three soft bits that include the sign bit;
   decoding the LDPC codeword using the hard bit and the three soft bits; and
   performing a read recovery operation on the TU using the decoded LDPC codeword.

2. The method of claim 1, wherein decoding the LDPC codeword comprises generating a log likelihood ratio (LLR) based on the three soft bits.

3. The method of claim 2, wherein generating the LLR comprises:
   generating a first LLR based on the two soft bits other than the sign bit; and
   generating a second LLR based on the sign bit.

4. The method of claim 1, further comprising generating the sign bit in response to the TU including an error.

5. The method of claim 4, further comprising performing a read operation on a page of a block stripe including the TU.

6. The method of claim 1, further comprising generating the sign bit in response to an unsuccessful read retry operation of an error handling flow performed on the TU.

7. The method of claim 6, further comprising performing a RAIN recovery operation of the error handling flow in response to an unsuccessful recovery of the TU using the decoded LDPC codeword.

8. The method of claim 1, wherein generating the sign bit comprises performing a raw read of the TU, wherein performing the raw read of the TU yields the hard bit and two of the three soft bits other than the sign bit.

9. An apparatus, comprising:
   a memory configured to:
      store a hard bit, a first soft bit, and a second soft bit associated with a raw read of a translation unit (TU); and
      store a third soft bit based on a redundant array of independent NAND (RAIN) drop corresponding to the TU and the raw read of the TU; and
   control circuitry coupled to the memory and configured to direct:
      performance of the raw read of the TU;
      performance of an exclusive OR (XOR) operation on the RAIN drop and the raw read of the TU to generate the third soft bit; and
      execution of an error handling flow in response to a read error of the TU, wherein execution of the error handling flow comprises:
         performance of a number of read retries on the TU;
         in response to the number of read retries being unsuccessful, performing the XOR operation on the RAIN drop and the raw read of the TU to generate the third soft bit; and
         decode a low-density parity-check (LDPC) codeword comprising the hard bit and the first, second, and third soft bits.

10. The apparatus of claim 9, further comprising read recovery circuitry coupled to the memory and the control circuitry and configured to:
    perform the XOR operation on the RAIN drop and the raw read of the TU to generate the third soft bit;
    generate a first log likelihood ratio (LLR) based on the first and second soft bits;
    generate a second LLR based on the third soft bit; and
    decode the LDPC codeword using the first LLR and the second LLR to recover the TU.

11. The apparatus of claim 10, wherein the control circuitry comprises the memory and the read recovery circuitry.

12. The apparatus of claim 10, wherein the read recovery circuitry comprises:
    LLR generator circuitry coupled to the memory and configured to generate the first LLR and the second LLR;
    LDPC scrambler circuitry coupled to the LLR generator circuitry and configured to be deactivated in response to receipt of the first LLR and the second LLR;
    LDPC decoder circuitry coupled to the LDPC scrambler circuitry and configured to decode the LDPC codeword using the first LLR and the second LLR.

13. The apparatus of claim 10, wherein the read recovery circuitry is further configured to direct communication of the recovered TU to a component that issued a read request for the TU.

14. A non-transitory computer-readable medium comprising instructions that, when executed by a processing device, cause the processing device to:
    execute an error handling flow in response to a translation unit (TU) including an error,
    wherein the instructions to execute the error handling flow comprise instructions executable to:
       perform a number of read retry operations on the TU;
       responsive to the number of read retry operations failing to recover the TU, performing an exclusive OR (XOR) operation on a redundant array of independent NAND (RAIN) drop corresponding to the TU and a raw read of the TU, wherein a result of the XOR operation is a sign bit of a low-density parity-check (LDPC) codeword associated with the TU;

decode the LDPC codeword using the sign bit and a hard bit and two soft bits based on the raw read of the TU; and attempt to recover the TU using the decoded LDPC codeword.

15. The non-transitory computer-readable storage medium of claim 14, further comprising instructions that, when executed by the processing device, cause the processing device to determine whether the attempt to recover the TU is successful.

16. The non-transitory computer-readable storage medium of claim 15, further comprising instructions that, when executed by the processing device, cause the processing device to, responsive to determining that the attempt to recover the TU is unsuccessful, perform a RAIN recovery operation.

17. The non-transitory computer-readable storage medium of claim 15, further comprising instructions that, when executed by the processing device, cause the processing device to, responsive to determining that the attempt to recover the TU is successful, exiting the error handling flow.

18. The non-transitory computer-readable storage medium of claim 14, wherein the instructions to execute the error handling flow further comprise instructions that, when executed by the processing device, cause the processing device to:

prior to performing the XOR operation, attempt to recover the TU using a different LDPC codeword comprising the hard bit and the two soft bits; and determine whether the attempt to recover the TU using the different LDPC codeword is successful.

19. The non-transitory computer-readable storage medium of claim 18, further comprising instructions that, when executed by the processing device, cause the processing device to, responsive to determining that the attempt to recover the TU using the different LDPC codeword is unsuccessful, perform the XOR operation.

20. The non-transitory computer-readable storage medium of claim 18, further comprising instructions that, when executed by the processing device, cause the processing device to, responsive to determining that the attempt to recover the TU using the different LDPC codeword is successful, exiting the error handling flow.

\* \* \* \* \*